(12) United States Patent
Hutton et al.

(10) Patent No.: US 7,050,770 B1
(45) Date of Patent: May 23, 2006

(54) LINEARIZED AMPLIFIER HAVING A BYPASS CIRCUIT

(75) Inventors: Donald Hutton, Argyle, TX (US); Eero Valitalo, Coppell, TX (US); Mika Hirvilampi, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/533,522

(22) Filed: Mar. 23, 2000

(51) Int. Cl.
*H04B 7/00* (2006.01)

(52) U.S. Cl. ............... 455/126; 455/69; 455/127.1; 330/149; 330/151

(58) Field of Classification Search ........... 455/127, 455/117, 343, 126, 69, 522, 63; 330/149, 330/151, 43, 124 R
See application file for complete search history.

(56) References Cited

U.S. PATENT DOCUMENTS

| 4,878,030 A | * | 10/1989 | Vincze | 330/149 |
|---|---|---|---|---|
| 5,287,543 A | * | 2/1994 | Wolkstein | 455/13.3 |
| 5,524,285 A | * | 6/1996 | Wray et al. | 455/126 |
| 5,966,049 A | * | 10/1999 | Yuen et al. | 330/149 |
| 6,188,279 B1 | * | 2/2001 | Yuen et al. | 330/149 |

* cited by examiner

*Primary Examiner*—Tilahun Gesesse
(74) *Attorney, Agent, or Firm*—Squire, Sanders & Dempsey L.L.P.

(57) ABSTRACT

A linearized amplifier comprising a RF input for receiving a modulated signal and a RF output for supplying a linearly amplified modulated signal. The RF input is connected to a first junction. The linearized amplifier further comprises a linearizer having an input connected to the first junction and a output connected to a second junction. The first junction defines a first path connected to the second junction through the linearizer for linearizing the modulated signal at a first defined range of power and a second path connected to the second junction bypassing the linearizer at a second defined range of power. The linearized amplifier further comprises a amplifier having a input connected to the second junction and a output connected to the RF output for supplying the linearly amplified modulated signal.

6 Claims, 2 Drawing Sheets

LINEARIZED AMPLIFIER HAVING A BYPASS CIRCUIT

FIELD OF THE INVENTION:

The present invention relates, in general, to linearised amplifiers and, in particular, to a method and apparatus for controlling noise generated by the linearised amplifier.

BACKGROUND OF THE INVENTION

Without limiting the scope of the invention, its background is described in connection with a linearised amplifier.

A wireless communication system may use a digital cellular standard such as the IS-95 protocol or the IS-136 protocol to define a common method of communication between a mobile telephone (mobile station) and a base station. The IS-95 protocol may use Code Division Multiple Accessing (CDMA) or the IS-136 may use Time Division Multiple Accessing (TDMA) signaling mode to utilize available channel frequencies. For example, the TDMA signaling mode, such as that used in a Global System for Mobile (GSM), defines a carrier frequency comprising eight TDMA channels having eight time slots with each time slot allocated to one mobile station within a geographic area. Each time slot carries either speech or control data in a burst form.

The wireless communication system may use a digital modulation scheme such as Amplitude Modulation (AM), Frequency Modulation (FM) or Phase Modulation (PM) to modulate a carrier frequency with speech or control data. The wireless communication system uses a transmitter to transmit the modulated signal. The transmitter comprises a linearised amplifier comprising a lineariser and a power amplifier (PA) to linearly amplify the modulated signal to be transmitted.

The lineariser used in connection with the PA may be used to reduce distortion generated by the PA. For example, the PA may generate distortion when the PA is required to operate at high power levels where the PA operates at or near saturation. The lineariser reduces distortion by compensating the modulated signal to offset non-linear characteristics generated by the PA. The lineariser used in connection with the PA introduces distortion into the modulated signal that is the complement of the signal distortion generated by the PA. The distortion generated by the PA negates the distortion introduced by the lineariser producing a near linear output characteristic.

Turning to FIG. 1, where a prior art linearised amplifier utilized in RF transmitters is illustrated and denoted generally as 10. Linearised amplifier 10 comprises an RF input 12 for receiving a modulated signal and an RF output 14 for supplying a linearly amplified modulated signal. Linearised amplifier 10 further comprises a lineariser 16 and a Power Amplifier (PA) 18 disposed between RF input 12 and RF output 14. Lineariser 16 introduces distortion into the received modulated signal negating the affects of distortion when amplifier 18 is forced to operate at or near saturation during periods of high power levels. Lineariser 16 generates distortion based on input power level or distortion characteristics detected in a negative feedback circuit 20.

Linearised amplifier 10 as illustrated uses negative feedback circuit 20 to control the linearity of PA 18. However, although linearised amplifier 10 as illustrated utilizes negative feedback circuit 20, an open loop or closed loop controlled architecture may be used. For example, the architectural type of linearised amplifier 10 may be a Cartesian loop linear architecture, adaptive baseband predistortion architecture, Envelope Elimination and Restoration (EE&R) architecture or a Linear Amplification using Non-Linear Components (LINC) and its derivative Combined Analogue-Locked Loop Universe Modulator (CALLUM) architecture.

Although lineariser 16 may reduce distortion when PA 18 is operating at or near saturation, lineariser 16 may have a negative affect when PA 18 is operating under normal conditions. During normal operation of PA 18 lineariser 16 generates noise causing the noise figure of linearised amplifier 10 to increase. The increase in noise figure will significantly affect the quality of the modulated signal at normal operating conditions.

As may be seen, an improved apparatus to control unwanted of a linearised amplifier could improve the quality of the modulated signal to be transmitted.

SUMMARY OF THE INVENTION

The present invention presents an improved apparatus for reducing noise generated from a linearised amplifier. This improves the quality of the amplifier output.

In an embodiment, the invention comprises a linearised amplifier comprising a RF input for receiving a modulated signal and a RF output for supplying a linearly amplified modulated signal. The RF input is connected to a first junction. The linearised amplifier comprises a lineariser having an input connected to the first junction and a output connected to a second junction. The first junction defines a first path connected to the second junction through the lineariser for linearising the modulated signal at a first defined range of power and a second path connected to the second junction bypassing the lineariser at a second defined range of power. The linearised amplifier further comprises a amplifier having a input connected to the second junction and a output connected to the RF output for supplying the linearly amplified modulated signal.

In the embodiment, the linearised amplifier further comprises a switch disposed within the second path and having a open and a closed position, wherein the open position creates a discontinuity in the second path and the closed position creates continuity in the second path. The linearised amplifier further comprises a control circuit having a control output connected to the switch for providing a control signal. The control signal indicating the first or the second defined range of power. The control signal causes the open position at the first defined range of power and the closed position at the second defined range of power.

In an alternative embodiment, the invention comprises a linearised amplifier comprising a RF input for receiving a modulated signal and a RF output for supplying a linearly amplified modulated signal. The RF input is connected to a first switch. The linearised amplifier further comprises a lineariser having an input connected to the first switch and a output connected to a second switch. The first switch defines a first path connected to the second switch through the lineariser for linearising the modulated signal at a first defined range of power and a second path connected to the second switch bypassing the lineariser at a second defined range of power. The linearised amplifier further comprises a amplifier having a input connected to the second switch and a output connected to the RF output for supplying the linearly amplified modulated signal.

In the alternative embodiment, the lineariser further comprises a control circuit having a control output connected to the first switch and the second switch. The control output contains a control signal. The control signal indicating the first or the second range of power. The control signal causes a first position of the switch, the first position indicating the first range of power, and a second position of the switch, the second position indicating the second range of power. The first position defines the first path and the second position defines the second path.

BRIEF DESCRIPTION OF THE DRAWINGS

For a more complete understanding of the present invention, including its features and advantages, reference is made to the detailed description of the invention, taken in conjunction with the accompanying drawings of which.

DETAILED DESCRIPTION OF THE INVENTION

While the use and implementation of particular embodiments of the present invention are presented in detail below, it will be understood that the present invention provides many inventive concepts, which can be embodied in a wide variety of contexts. The specific embodiments discussed herein are mere illustrations of specific ways for making and using the invention and are not intended to limit the scope of the invention.

Figure 1:
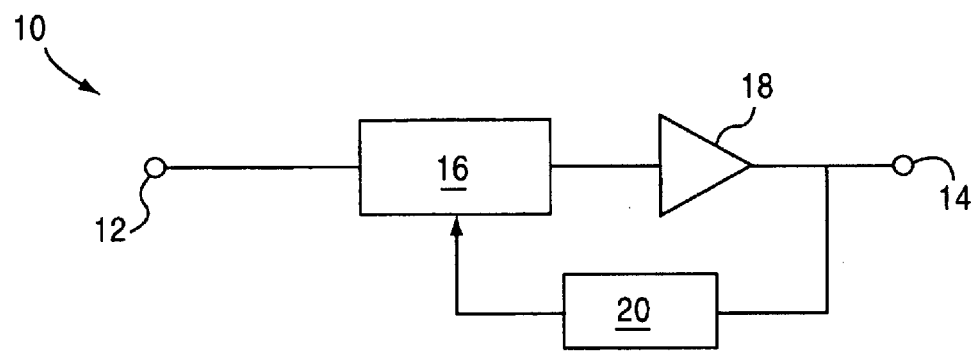
FIG. 1 is a block diagram of a prior art linearised amplifier.
Figure 2:
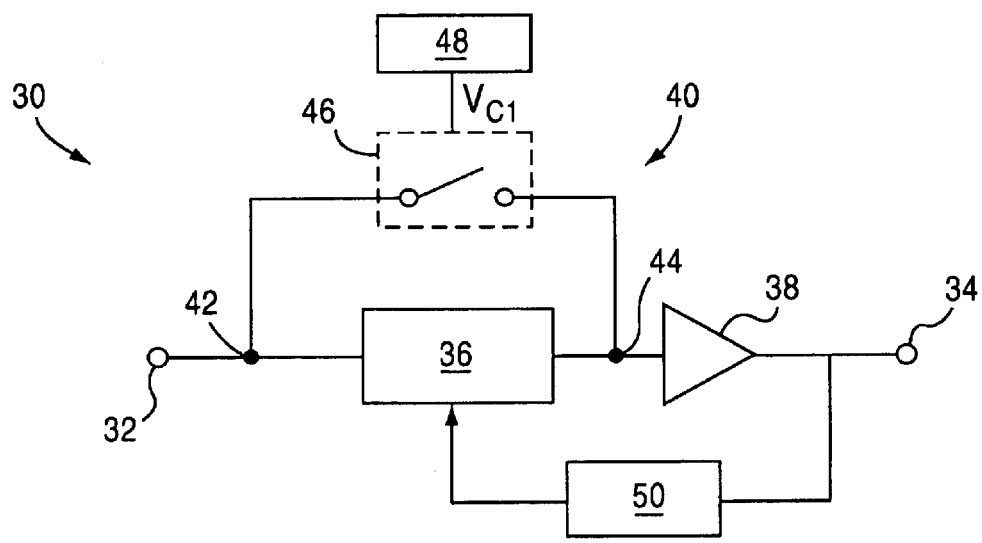
FIG. 2 is a linearised amplifier according to an embodiment of the invention.

Referring now to FIG. 2, therein is illustrated a linearised amplifier 30 according to an embodiment of the invention. Linearised amplifier 30 comprises a RF input 32 for receiving modulated signals and a RF output 34 for supplying a linearly amplified modulated signal. Linearised amplifier 30 further comprises a lineariser 36 connected to RF input 32 and a Power Amplifier (PA) 38 connected to RF output 34. Lineariser 36 introduces distortion into the modulated signal to complement distortion generated by PA 38 at high power levels. Linearised amplifier 30 further comprises a bypass circuit 40 comprising a first lead connected to the input of lineariser 36 creating a first junction 42 and a second lead connected the output of lineariser 36 creating a second junction 44.

First junction 42 is connected to RF input 32 and defines a first path connected to second junction 44 through lineariser 36. First junction 42 also defines a second path connected to second junction 44 through a switch 46. A control circuit 48 supplies a control signal $V_{c1}$ for controlling switch 44 at a defined power level. Control circuit 48 may supply control signal $V_{c1}$ according to power measurements collected from several different sources. For example, control circuit can monitor power level by sampling the detected voltage, the reference voltage used in power control circuits utilized in most power amplifier applications or the control signal can come from processing circuitry, such as a Digital Signal Processor (DSP), used in some transmitter applications.

During low power levels, when PA 38 is operating under normal conditions, switch 46 is closed and lineariser 38 is bypassed to avoid introducing unwanted distortion. During higher power levels, when amplifier 40 is operating at or near saturation, switch 44 is opened and lineariser 38 is utilized. PA 38 connected to second junction 34 supplies a linearly amplified signal at RF output 34 with reduced distortion at all power levels.

Linearised amplifier 30 as illustrated uses a negative feedback circuit 50 to control the linearity of PA 38. However, although linearised amplifier 30 as illustrated utilizes negative feedback circuit 50 an open loop or closed loop controlled architecture may be used. For example, the architectural type of linearised amplifier 30 may be a Cartesian loop linear architecture, adaptive baseband predistortion architecture, Envelope Elimination and Restoration; (EE&R) architecture or a Linear Amplification using Non-Linear Components (LINC) and its derivative Combined Analogue-Locked Loop Universe Modulator (CALLUM) architecture.

Figure 3:
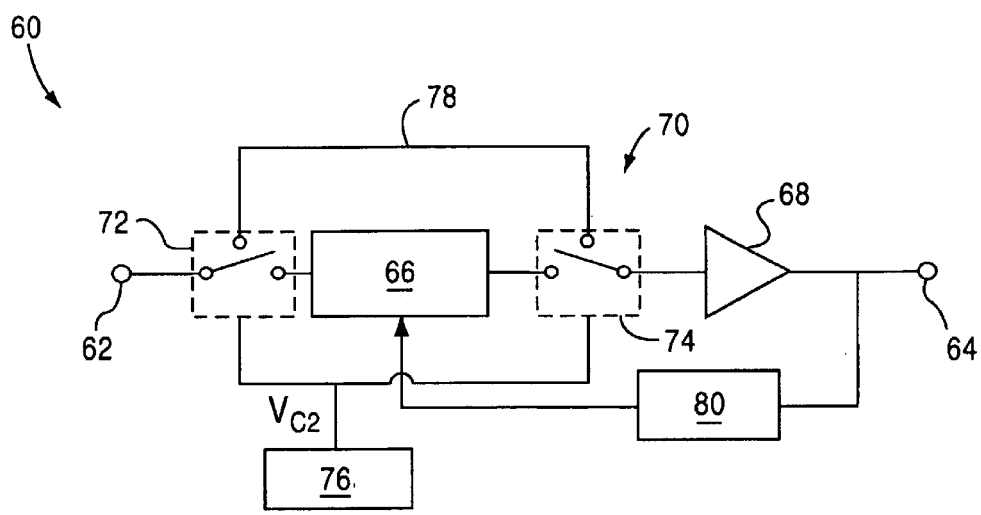
FIG. 3 is a linearised amplifier according to an alternative embodiment of the invention.

Referring now to FIG. 3, therein is illustrated a linearised amplifier 60 according to an alternative embodiment of the invention. Linearised amplifier 60 comprises a RF input 62 for receiving modulated signals and a RF output 64 for supplying a linearly amplified modulated signal. Linearised amplifier 60 further comprises a lineariser 66 connected to RF input 62 and a Power Amplifier (PA) 68 connected to RF output 64. Lineariser 66 introduces distortion into the modulated signal to complement distortion generated by PA 68 at high power levels when PA 68 is operating at or near saturation. Linearised amplifier 60 further comprises a bypass circuit 70 comprising a first switch 72, a second switch 74 and a control circuit 76 for supplying a control voltage $V_{c2}$.

First switch 72 defines a first path connected to second switch 74 through lineariser 66. First switch 72 also defines a second path 78 connected to second switch 74 for bypassing lineariser 66. Control circuit 76 supplies control signal $V_{c2}$ for controlling first switch 72 and second switch 74 at a defined power level. Control circuit 76 may supply control signal $V_{C2}$ according to power measurements collected from several different sources. For example, control circuit 76 can monitor power level by sampling the detected voltage, the reference voltage used in power control circuits utilized in most power amplifier applications or control signal $V_{C2}$ can come from processing circuitry, such as a Digital Signal Processor (DSP), used in some transmitter applications.

During low power levels when PA 68 is operating under normal conditions first switch 72 and second switch 74 are positioned correctly and lineariser 66 is bypassed to avoid introducing unwanted distortion. During higher power levels when PA 68 is operating at or near saturation first switch 72 and second switch 74 are positioned correctly and lineariser 66 is utilized to reduce distortion. PA 68 connected to second switch 74 supplies a linearly amplified modulated signal at RF output 64 with minimum distortion.

Linearised amplifier 60 as illustrated uses a negative feedback circuit 80 to control the linearity of PA 68. However, although linearised amplifier 60 as illustrated utilizes negative feedback circuit 80 an open loop or closed loop controlled architecture may be used. For example, the architectural type of linearised amplifier 60 may be a Cartesian loop linear architecture, adaptive baseband predistortion architecture, Envelope Elimination and Restoration (EE&R) architecture or a Linear Amplification using Non-Linear Components (LINC) and its derivative Combined Analogue-Locked Loop Universe Modulator (CALLUM) architecture.

Figure 4:
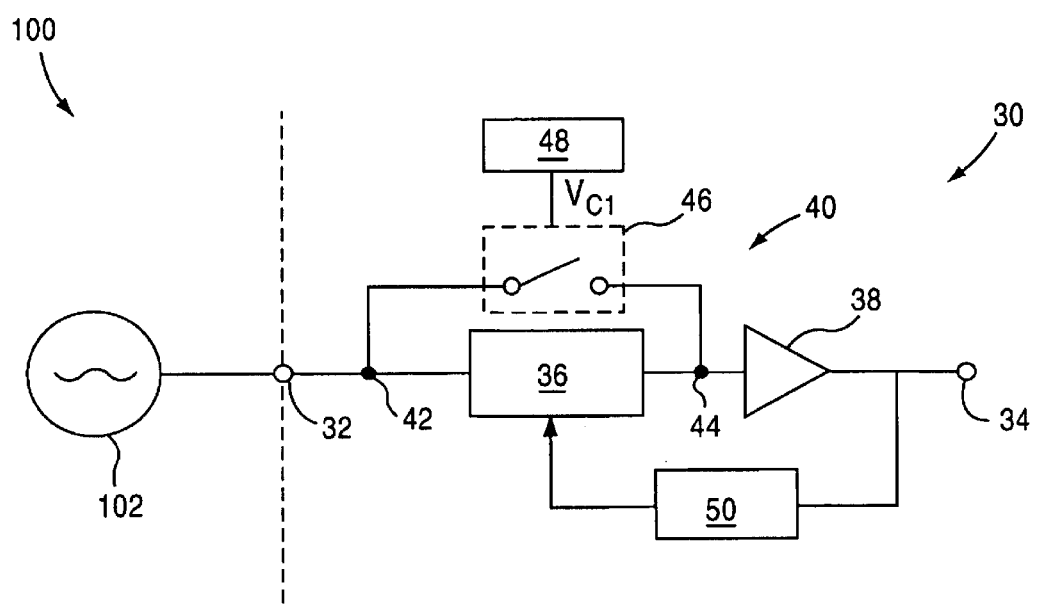
FIG. 4 is a preferred embodiment of the invention of FIG. 2 or FIG. 3.

Turning now to FIG. 4, where a transmitter application used in wireless communication systems, such as a GSM architecture, is illustrated and denoted generally as 100.

Transmitter 100 comprises a modulator 102 connected to linearised amplifier 30. Transmitter 100 utilizing linearised amplifier 30 will experience less distortion at RF output 34 at all power levels resulting in a clearer transmitted signal. Although transmitter 100 is illustrated utilizing linearised amplifier 30, linearised amplifier 60 may also be used in transmitter applications such as the one illustrated.

While this invention has been described with reference to particular embodiments, this description is not intended to be limiting. Various modifications and combinations of the illustrative embodiments, as well as other embodiments of the invention, will be apparent to persons skilled in the art. It is, therefore, intended that the appended claims encompass any such modifications or embodiments.

What is claimed is:

1. A linearized amplifier comprising:

a Radio Frequency (RF) input for receiving a modulated signal, said RF input connected to a first junction;

an RF output for supplying a linearly amplified modulated signal;

a linearizer having an input connected to said first junction and an output connected to a second junction, wherein said first junction defines a first path connected to said second junction through said linearized for linearizing said modulated signal at a first defined range of power and a second path connected to said second junction bypassing said linearizer at a second defined range of power; and an amplifier having an input connected to said second junction and an output connected to said RF output for supplying said linearly amplified modulated signal.

2. The linearized amplifier as recited in claim 1, wherein said linearizer further comprises:

a switch disposed within said second path and having an open and a closed position, wherein said open position creates a discontinuity in said second path and said closed position creates continuity in said second path; and a control circuit having a control output connected to said switch for providing a control signal, said control signal indicating said first or said second defined rang of power, said control signal causing said open position at said first defined range of power and said closed position at said second defined range of power.

3. A linearized amplifier comprising:

a Radio Frequency (RF) input for receiving a modulated signal, said RF input connected to a first switch;

an RF output for supplying a linearly amplified modulated signal;

a linearizer having an input connected to said first switch and an output connected to a second switch, wherein said first switch defines a first path connected to said second switch through said linearizer for linearizing said modulated signal at a first defined range of power and a second path connected to said second switch bypassing said linearizer at a second defined range of power; and an amplifier having an input connected to said second switch and an output connected to said RF output for supplying said linearly amplified modulated signal.

4. The linearized amplifier as recited in claim 3, wherein said linearizer further comprises:

a control circuit having a control output connected to said first switch and said second switch, said control output containing a control signal, said control signal indicating said first or said second range of power, said control causing a first position of said switch, said first position indicating said first range of power, and a second position of said switch, said second position indicating said second range of power, said first position defining said first path and said second position defining said second path.

5. A Radio Frequency (RF) transmitter comprising:

a modulator for modulating an RF signal with information;

an RF input for receiving a modulated signal, said RF input connected to said modulator and to a first junction;

an RF output for supplying a linearly amplified modulated signal;

a linearizer having an input connected to said first junction and an output connected to a second junction, wherein said first junction defines a first path connected to said second junction through said linearizer for linearizing said modulated signal at a first defined range of power and a second path connected to said second junction bypassing said linearizer at a second defined range of power; and an amplifier having an input connected to said second junction and an output connected to said RF output for supplying said linearly amplified modulated signal.

6. The RF transmitter as recited in claim 5, wherein said linearizer further comprises:

a switch disposed within said second path and having an open and a closed position, wherein said position creates a discontinuity in said second path and said closed position creates continuity in said second path; and a control circuit having a control output connected to said switch for providing a control signal, said control signal indicating said first of said second defined range of power, said control signal causing said open position at said defined range of power and said closed position at said second defined range of power.

* * * * *